(12) United States Patent
Qiu et al.

(10) Patent No.: US 6,803,702 B2
(45) Date of Patent: Oct. 12, 2004

(54) PIEZOELECTRIC ELEMENT AND METHOD OF MANUFACTURING SAME

(75) Inventors: Hong Qiu, Beijing (CH); Koji Sumi, Nagano (JP); Tsutomu Nishiwaki, Nagano (JP); Masanori Okuyama, Osaka (JP); Zhiqiang Wei, Osaka (JP)

(73) Assignee: Seiko Epson Corporation, Tokyo (JP)

( * ) Notice: Subject to any disclaimer, the term of this patent is extended or adjusted under 35 U.S.C. 154(b) by 5 days.

(21) Appl. No.: 10/050,586

(22) Filed: Jan. 18, 2002

(65) Prior Publication Data

US 2002/0071969 A1 Jun. 13, 2002

Related U.S. Application Data

(62) Division of application No. 09/534,573, filed on Mar. 27, 2000, now Pat. No. 6,419,849.

(30) Foreign Application Priority Data

| Mar. 25, 1999 | (JP) | ............................................. 11-81285 |
| Aug. 27, 1999 | (JP) | ........................................ 11-242366 |
| Aug. 27, 1999 | (JP) | ........................................ 11-242367 |
| Mar. 24, 2000 | (JP) | ........................................ 2000-85232 |

(51) Int. Cl.[7] ............................................. H01L 41/08
(52) U.S. Cl. ..................................................... 310/358
(58) Field of Search ......................................... 310/358

(56) References Cited

U.S. PATENT DOCUMENTS

| 4,643,984 A | 2/1987 | Abe et al. .................... 501/134 |
| 4,829,033 A | 5/1989 | Menashi et al. ............. 501/139 |
| 4,832,939 A | 5/1989 | Menashi et al. ............. 423/598 |

FOREIGN PATENT DOCUMENTS

| EP | 911891 A2 | 4/1999 |
| WO | WO 90/06292 | 6/1990 |

OTHER PUBLICATIONS

W–Ping Xu et al., *Application of Hydrothermal Mechanism for Tailor–Making Perovskite Titanate Films*, IEEE Proc. of the 9th International Symposium on Electrets in Shangai, China, pp. 617–622 (Sep. 25–30, 1996).

*Primary Examiner*—Thomas M. Dougherty
(74) *Attorney, Agent, or Firm*—Sterne, Kessler, Goldstein & Fox P.L.L.C.

(57) ABSTRACT

When a piezoelectric material is manufactured by hydrothermal method, the proper amount of lead contained in the piezoelectric film can be ensured and decreases in piezoelectric characteristics can be prevented. A method for manufacturing a piezoelectric material expressed by the formula $ABO_3$, containing an element "a" as the element expressed by A above, and having a perovskite crystal structure, comprises a first step of producing an oxide containing an element "a", and a second step of producing a piezoelectric material by subjecting the oxide produced in the first step to a hydrothermal processing using an aqueous solution containing the element "a", wherein the amount of the element "a", contained in the piezoelectric material produced in the second step is increased over the amount of the element "a" contained in the oxide produced in the first step.

6 Claims, 15 Drawing Sheets

Electric field strength dependence of strain

●—● dislocation  4 layers
▲—▲ layers      3 layers
○—○             1 layer

Note: Ultimate strain indicates the strain limit at which the film breaks.

PIEZOELECTRIC ELEMENT AND METHOD OF MANUFACTURING SAME

BACKGROUND OF THE INVENTION

1. Field of the Invention

The present invention relates to a method for manufacturing a piezoelectric material such as a piezoelectric ceramic, and more particularly relates to a method for manufacturing a piezoelectric material having a perovskite crystal structure using a hydrothermal processing. The present invention also relates to method for manufacturing a piezoelectric element that utilizes this piezoelectric material, and more particularly a piezoelectric element that functions as an ink discharge drive source for an on-demand type of ink jet recording head.

2. Description of the Related Art

Most piezoelectric bodies which can be expressed by the formula $ABO_3$ have a perovskite crystal structure. Of these piezoelectric bodies, those having a specific composition exhibit an electromechanical conversion action, and are utilized as piezoelectric elements. For instance, lead-zirconate titanate (abbreviated as PZT), in which lead (Pb) is used for A and a mixture of zirconium (Zr) and titanium (Ti) is used for B, exhibits extremely good piezoelectric characteristics, and has become an important piezoelectric material in actuators such as ink jet recording heads.

A variety of methods have been employed in the past to manufacture a piezoelectric material. A method in which oxides are mixed and sintered is known as a first example thereof. This involves mixing lead oxide (PbO), zirconium oxide ($ZrO_2$), titanium dioxide ($TiO_2$), and other such oxides, pre-firing the mixture, grinding this product, and then sintering the resulting powder. This method makes possible the molding of bulk materials in particular.

A sol-gel method is known as a second example. This involves coating a substrate with a metal alkoxide solution (sol) containing lead (pb), zirconium (Zr), titanium (Ti), or the like by spin-coating or another such process, gelling this coating, and sintering the amorphous thin film thus obtained.

A third example is sputtering. This involves performing sputtering using an alloy of lead (Pb), zirconium (Zr), titanium (Ti), or the like as the target, and heat treating the amorphous thin film thus obtained.

With the above methods, the composition of the metal elements which make up the piezoelectric material that is the final product can be controlled to a certain extent by determining the composition of the metal elements included in the raw material.

As another example of a method for manufacturing a piezoelectric material, the thesis "Application of Hydrothermal Mechanism for Tailor-making perovskite Titanate Films," IEEE proc. of the $9^{th}$ Int'l Symp. on Electrets, Shanghai, China, Sept. 25–30, pp. 617–622 (1996), Wuping Xu, Masanori Okuyama, et al., discloses a technique of crystallizing a piezoelectric film precursor by a hydrothermal method. This hydrothermal method involves coating a substrate with a sol of an organometal in an amorphous state, then subjecting it to a hydrothermal processing in an alkali aqueous solution, thereby promoting the orientation of metal atoms and crystallizing them into a perovskite crystal structure.

This hydrothermal method has numerous advantages because a piezoelectric film precursor can be crystallized at a lower temperature than when a film is formed by any of the first to third methods mentioned above. For example, because a low-temperature process allows for a reduction in the internal stress generated in the film in the course of the crystallization of the piezoelectric film precursor, cracking can be prevented and it is possible to form a thick film of a piezoelectric material. The ability to form a piezoelectric thick film enhances the reliability of the film because of the weak electric field produced in the film when a voltage is applied. A low-temperature process also makes a line printer feasible because of the low internal stress in the film.

Incidentally, it is mentioned in the above thesis that an alkali aqueous solution is used as the treatment solution in the crystallization of the piezoelectric film precursor. However, since the pressure chamber substrate of an ink jet recording head, for example, is produced by the fine working of a silicon substrate, it is undesirable to use a strongly alkaline aqueous solution of potassium hydroxide or the like as the treatment solution because the substrate or the piezoelectric material ends up being etched. In view of this, from the standpoints of making the substrate and other components resistant to etching, promoting the crystallization of the piezoelectric film precursor, and so forth, a barium hydroxide aqueous solution or a lead hydroxide aqueous solution has been used as the treatment solution.

SUMMARY OF THE INVENTION

The inventor, however, discovered that the lead content in the piezoelectric material decreases if a piezoelectric film precursor such as lead zirconate-titanate ($Pb(Zr,Ti)O_3$; PZT) is crystallized using barium hydroxide as the treatment solution.

FIG. 5 is the EDX (Energy Dispersive X-ray Analysis) spectrum of a piezoelectric film ($Pb(Zr_{0.56}Ti_{0.44})O_3$) crystallized by a hydrothermal processing with barium hydroxide alone, and FIG. 6 is the EDX spectrum of a piezoelectric film ($Pb(Zr_{0.56}Ti_{0.44})O_3$) formed by sol-gel method. In these figures, the horizontal axis is the characteristic X-ray energy, and the vertical axis is the X-ray intensity. It can be seen from these experimental results that the lead content in a piezoelectric film crystallized by hydrothermal processing with barium hydroxide is smaller than the lead content in a piezoelectric film formed by sol-gel method.

When the lead content decreases in a piezoelectric film, there is a drop in both dielectric and piezoelectric properties. Accordingly, if a piezoelectric element featuring a piezoelectric material crystallized by hydrothermal processing using barium hydroxide is used as an ink discharge drive source, the ink discharge characteristics may not be as good as in the past. Similarly, when a crystalline film of a piezoelectric material is manufactured by hydrothermal processing, a drawback is that the metal elements contained in the initial piezoelectric material are lost, and the composition of the manufactured product cannot be controlled as expected. On the other hand, SEM (Scanning Electron Microscopy) observation revealed that crystallization is hindered when a lead hydroxide aqueous solution is used as the treatment solution.

With a conventional crystallization method involving sintering, a step of sintering under high-temperature conditions is essential, which means that metal components such as lead (Pb) evaporate and scatter during heating. This causes a problem in that the component ratio of the intended piezoelectric material tends to deviate from the component ratio of the piezoelectric material actually obtained, and also requires finding some way to keep the vaporized metal components (such as lead) from being discharged into the outside environment, which drives up the cost.

In view of this, it is an object of the present invention to provide a manufacturing method with which a decrease in piezoelectric characteristics can be prevented and the proper lead content can be ensured in a piezoelectric film when the piezoelectric material is manufactured by a hydrothermal method. The present invention further provides a method for easily controlling the component ratio of the metal elements that make up the piezoelectric material. Also provided is a method for manufacturing a piezoelectric material that imposes less burden in terms of environmental concerns, such as preventing the outflow of metals.

It is a further object to provide a method for manufacturing a piezoelectric element that is an ink discharge drive source by the above manufacturing method, and for manufacturing an ink jet recording head with superior ink discharge characteristics. Another object is to provide an ink jet printer equipped with this ink jet recording head.

The inventor investigated the compositional changes of a hydrothermal processing in light of the above drawbacks, whereupon they found that the cause of these drawbacks is that a divalent metal element (A site element) is replaced with a metal element in the aqueous solution in the course of the hydrothermal processing. The inventor then hit upon utilizing this phenomenon to control the composition of the piezoelectric material that is the final product.

The present invention is a method for manufacturing a piezoelectric material having a perovskite crystal structure expressed by the formula $ABO_3$ in which e symbol A represents at least an element "a" comprising a first step of producing an oxide containing an element "a", and a second step of producing a piezoelectric material by subjecting the oxide containing the element "a" produced in the first step to a hydrothermal process using an aqueous solution containing the element "a"', wherein the amount of element "a"' contained in the piezoelectric material produced in the second step is increased due to its substitution for element "a" contained in the oxide produced in the first step.

With this manufacturing method, it is possible to control the element (A site element) in a piezoelectric material expressed by the formula $ABO_3$ and having a perovskite crystal structure. Also, a piezoelectric material can be manufactured in an environment with a lower temperature than when one is formed by sintering, and it is possible to manufacture the piezoelectric material in the form of a thick film, in larger size and in bulk.

The element "a"' used in the second step may be an element not contained in the oxide produced in the first step. This allows the element to be contained at the A site to be contained at the A site of the final product even though it is not contained in the oxide prior to the execution of the hydrothermal processing in the second step.

The oxide produced in the first step may be a piezoelectric material expressed by the formula $ABO_3$ in which the symbol A represents at least an element "a", and having a perovskite crystal structure. This allows the hydrothermal process of the second step to be performed for the piezoelectric material that has already been crystallized in a perovskite crystal structure, and allows the element "a" at the A site of this piezoelectric material to be substituted with the element "a"'.

The first step may involve subjecting an oxide in an amorphous state to a hydrothermal processing using an aqueous solution containing the element "a"', and crystallizing the oxide in the amorphous state. Thus, the hydrothermal processing may be carried out in a total of two stages in the first and second steps.

The method of the present invention for manufacturing a piezoelectric material may be such that the oxide produced in the first step is an oxide in an amorphous state, and the hydrothermal processing in the second step crystallizes the oxide produced in the first step. Thus, a treatment in which an oxide in an amorphous state is crystallized and a treatment in which the desired element is introduced at the A site of the piezoelectric material that is the final product may be carried out at the same time by means of the hydrothermal processing in the second step.

The hydrothermal processing in the second step is preferably conducted using an aqueous solution containing both the element "a" and the element "a"' or another element expressed by A. As a result, when the element "a" is introduced into the final product, for example, an element that enhances the piezoelectric characteristics (such as lead) is used, and when the element "a"' is made into an alkali aqueous solution used in the hydrothermal processing, an element that promotes crystallization (such as barium, strontium, or calcium) is used, allowing the crystallization of the oxide and the enhancement of the piezoelectric characteristics to be fully realized.

The ratio in which the element "a" and the element "a"' or another element expressed by A are present in the aqueous solution is preferably adjusted to between 2:8 and 4:6. Adjusting to this range allows the compositional ratio of the A site to be controlled in the piezoelectric material that is the final product.

The aqueous solution containing the element "a" is preferably an alkali aqueous solution of a compound expressed by the formula $a(OH)_n$ (n=1, 2, or 3). Also, the aqueous solution containing the element "a"' is preferably an alkali aqueous solution of a compound expressed by the formula $a'(OH)_n$ (n=1, 2, or 3).

The element "a" is preferably lead. This allows the piezoelectric characteristics of the piezoelectric material that is the final product to be enhanced. Also, the element "a"' is preferably one element selected from the group consisting of barium, strontium, lanthanum, and calcium. This allows the crystallization of the oxide in an amorphous state to be sufficiently promoted. It is also preferable for the element expressed by B to be zirconium and/or titanium.

The concentration of the aqueous solution used in the hydrothermal processing in the second step is preferably between 0.05 M (mol/L) and 2.0 M (mol/L). Also, the treatment temperature in the hydrothermal processing in the second step is preferably between 120° C. and 200° C. Furthermore, the treatment pressure in the hydrothermal processing in the second step is preferably between 2 atmospheres and 20 atmospheres. It is also preferable if the treatment time in the hydrothermal processing in the second step is between 15 minutes and 120 minutes.

The oxide in an amorphous state may be produced by coating and pyrolyzing with a sol containing an organometal.

The piezoelectric material may be composed of lead titanate ($PbTiO_3$), lead zirconate-lead-lanthanum zirconate-titanate ($(Pb,La)(Zr,Ti)O_3$), or lead zirconate-titanate magnesium-niobate ($Pb(Zr,Ti)(Mg,Nb)O_3$).

The present invention is also a method for manufacturing a piezoelectric element, comprising the steps of forming a lower electrode, forming over the lower electrode a film of a piezoelectric material exhibiting piezoelectricity by the above-mentioned method for manufacturing a piezoelectric material, and forming an upper electrode over the piezoelectric material.

The present invention is also a method for manufacturing an ink jet recording head, comprising the steps of forming a diaphragm film over a substrate, manufacturing a piezoelectric element over the diaphragm film by the above-mentioned method for manufacturing a piezoelectric material, and working the substrate and forming a pressurization chamber at a site capable of transmitting displacement of the diaphragm film produced by driving of the piezoelectric element.

In another method of the present invention for manufacturing a piezoelectric material, the element "a" is barium, the element "a'" is lead, and the element expressed by the symbol B is titanium. Furthermore, the oxide produced in the first step is preferably lead titanate ($PbTiO_3$) composed of acicular crystals. It is also preferable if the first step produces the oxide by Metal-Organic Deposition (hereinafter "MOD"). This makes it possible to manufacture a piezoelectric material that is $BaTiO_3$ composed of acicular crystals with a large grain size, and more accurately, barium-lead titanate expressed by the chemical formula $(Ba_xPb_{1-x})TiO_3$, where x in the formula is thin the range of $0<x<0.05$, which was difficult to manufacture with a conventional method.

The piezoelectric material of the present invention is expressed by the chemical formula $(Ba, Pb)TiO_3$, wherein the piezoelectric material is composed of acicular crystals, at a specific spacing there are dislocation layers in which lattice defects are present, and the spacing between adjacent dislocation layers is at least 10 nm. This makes it possible to provide barium-lead titanate with excellent voltage resistance and good piezoelectric characteristics. In particular, it is possible to provide barium-lead titanate expressed by the chemical formula $(Ba_xPb_{1-x})TiO_3$, where x in this formula is within the range of $0<x<0.05$.

The piezoelectric element of the present invention comprises the above-mentioned piezoelectric material and electrodes with which voltage can be applied to this piezoelectric material. This makes it possible to provide a piezoelectric element that has excellent voltage resistance and exhibits a favorable amount of displacement (deformation) with respect to the application of voltage. The ink jet recording head of the present invention is characterized in that the above-mentioned piezoelectric element is provided as a piezoelectric actuator. The printer of the present invention is characterized by being equipped with the above-mentioned ink jet recording head as a printing means.

DESCRIPTION OF THE PREFERRED EMBODIMENTS

Embodiments will now be described through reference to the various figures.

Description of Principle

Figure 7:
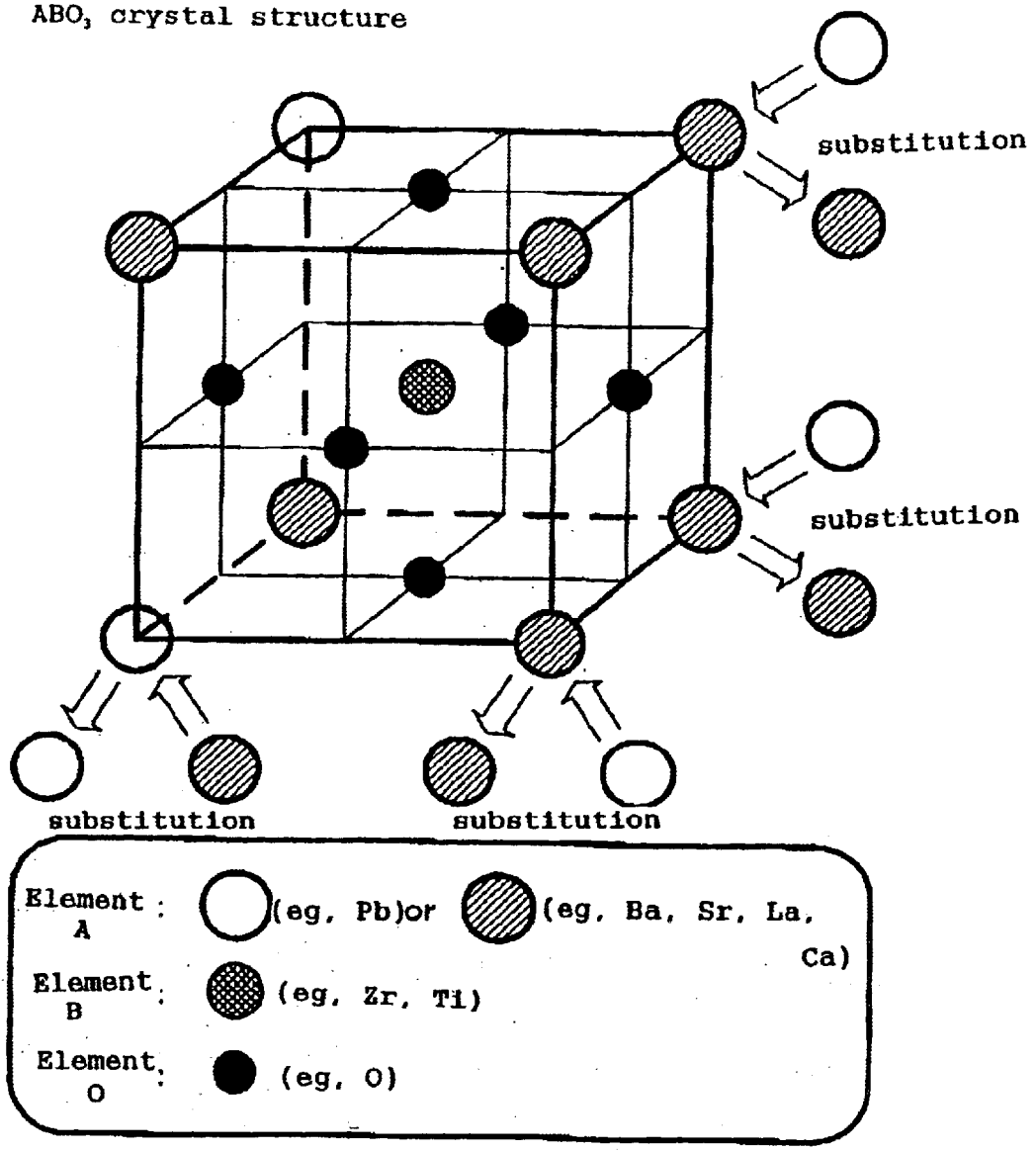
FIG. 7 is a principle diagram illustrating the substitution of A site atoms during the hydrothermal processing of the present invention.

FIG. 7 is a schematic representation of a perovskite crystal structure, which is a type of crystal structure of a piezoelectric material. In this crystal structure, the element A is a divalent metal element (such as Pb), the element B is a tetravalent metal element (such as Ti or Zr), and the element O is usually oxygen (O). Most piezoelectric bodies that are an oxide of these plurality of metal elements have a perovskite crystal structure. This crystal structure is self-polarizing. A piezoelectric material having this crystal structure exhibits an electromechanical convention action, commonly referred to as a piezoelectric action.

In the past, the composition of the final product was different from the composition during precursor molding, which was a problem in that the resulting piezoelectric material did not have adequate piezoelectric characteristics.

As a result of various experiments, the inventor discovered that the element contained in the alkali aqueous solution, such as barium (Ba), is substituted with the lead element contained in the original precursor in an amorphous state and is crystallized in the course of the hydrothermal processing for crystallizing the piezoelectric material. Specifically, crystallization is promoted while the element A at the orientation position commonly called the A site is substituted with another metal element (Ba) in the alkali aqueous solution used as the treatment solution. With a conventional hydrothermal method, the lead element in the precursor film was substituted with the metal element in the alkali aqueous solution in the course of the hydrothermal processing, so the lead element was lacking and sufficient polarization was not exhibited.

In view of this, the inventor came up with the idea of conversely taking advantage of the ease with which the metal element at the A site is substituted with the metal element in the aqueous solution in the course of the hydrothermal processing, and of having the element (such as barium) which is to be added to the piezoelectric material sinter that is the final product be included ahead of time in the alkali aqueous solution used for the hydrothermal processing. The barium element in the oxide prior to the hydrothermal processing is substituted with lead or another element contained in the alkali aqueous solution in the course of the hydrothermal processing. This substitution makes it possible for the lead element to be present in the piezoelectric film that is the final product in a far higher ratio than with a conventional hydrothermal method.

To put this the other way, including a plurality of metal elements in the alkali aqueous solution used in the hydrothermal method permits control of the ratio in which elements with a crystal structure are present, including both metal elements that are the final product. If the relation between the ratio in which metal elements are present by type in the alkali aqueous solution and the ratio in which metal elements are present in the final product could be clarified by experimentation or the like, it would be relatively easy to control the composition produced by a hydrothermal method, which was difficult in the past.

Also, if an oxide is subjected to a hydrothermal processing using an aqueous solution containing the element to be added at the A site, then this element can be added at the A site of a piezoelectric material after the hydrothermal processing.

Structure of an Ink Jet Printer

Figure 1:
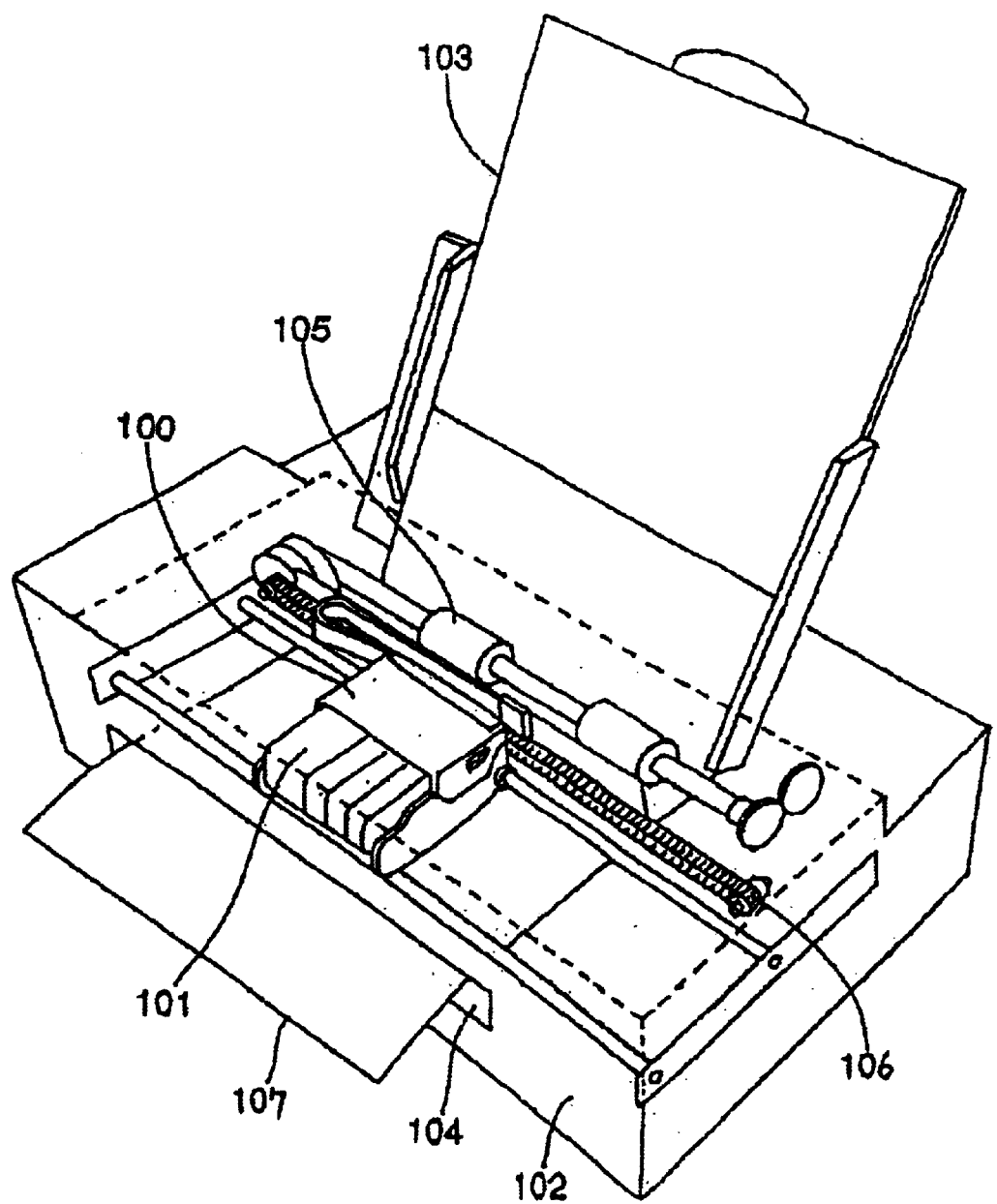
FIG. 1 is a structural diagram of an ink jet printer.

The structure of an ink jet printer will be described through reference to FIG. 1. An ink jet printer mainly comprises an ink jet recording head 100, a housing 102, a tray 103, and a head drive mechanism 106. This ink jet recording head 100 is equipped with a four-color (yellow, magenta, cyan, black) ink cartridge, and is designed so that full-color printing is possible.

This ink jet printer internally includes a CPU, memory, an interface circuit, and so forth, and receives print data from various clients connected to a network via connectors. The CPU stores this print data in a buffer memory, and develops to a specified address the print image described in the page description language. The CPU then controls the ink discharge timing of the ink jet recording head 100 and the scanning of the head drive mechanism 106 on the basis of the print image. The housing 102 is equipped with the tray 103 on its back side, and is equipped with an automatic sheet feeder 105 on its inside. Paper 107 is automatically fed out, and the paper 107 is discharged from a discharge port 104 on the front.

Structure of an Ink Jet Recording Head

Figure 2:
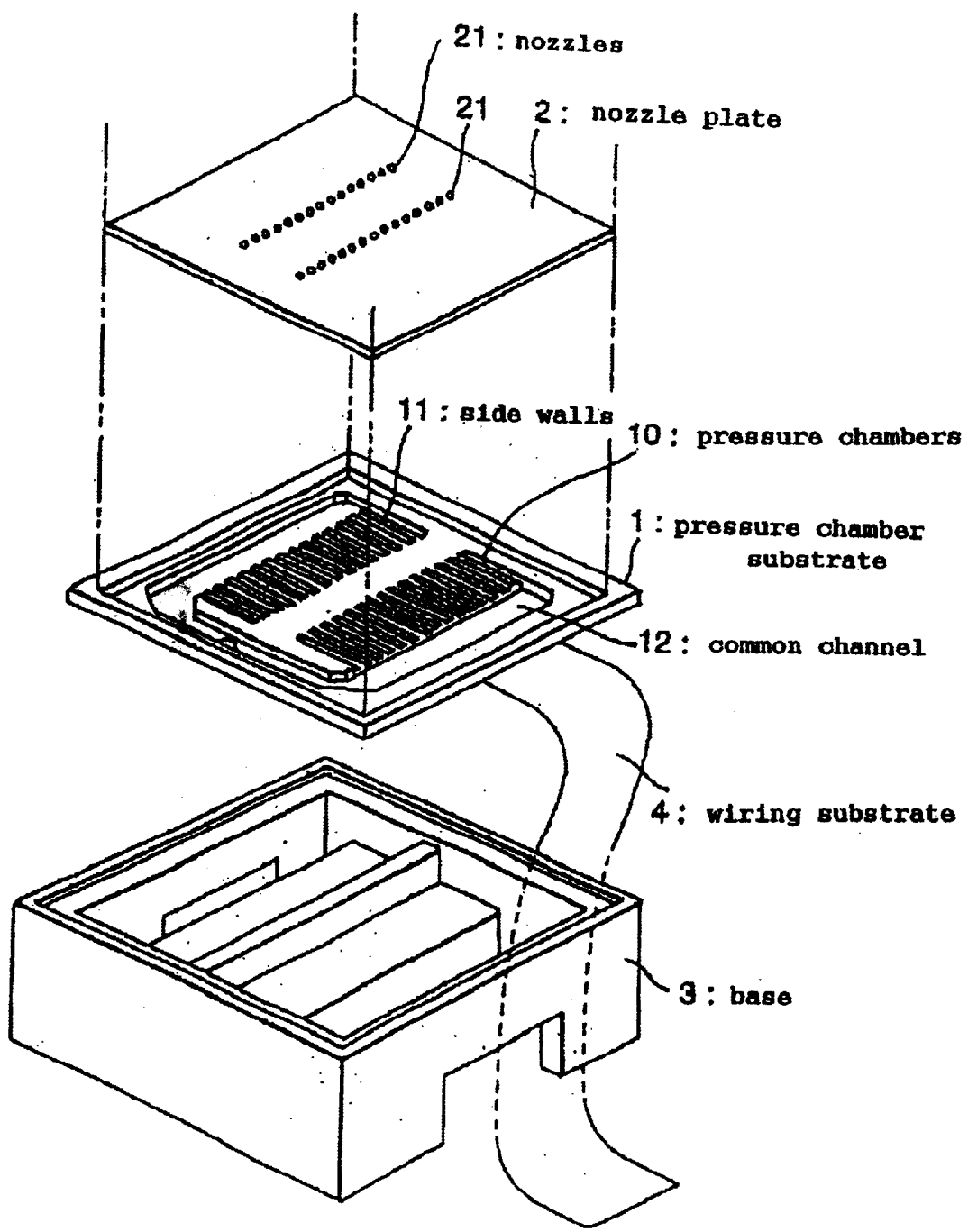
FIG. 2 is an exploded oblique view of an ink jet recording head.

FIG. 2 is an exploded oblique view of an ink jet recording head. The type shown here is provided with a common channel for ink inside the pressure chamber substrate. As shown in this figure, the ink jet recording head consists of a pressure chamber substrate 1, a nozzle plate 2, and a base 3. The pressure chamber substrate 1 is produced by etching or otherwise working a silicon single crystal substrate and then separating this into various components. A plurality of slender pressure chambers 10 are provided to the pressure chamber substrate 1, and a common channel 12 for supplying ink to all of the pressure chambers 10 is also provided. The pressure chambers 10 are separated from one another by side walls 11. piezoelectric elements are provided on the base 3 side of the pressure chamber substrate 1. Also, the wiring from the various piezoelectric elements is bundled on a wiring substrate 4 (a flexible cable) and connected with the external circuitry of the base 3.

The nozzle plate 2 is applied to the pressure chamber substrate 1. Nozzles 21 for discharging ink droplets are formed at locations corresponding to the pressure chambers 10 in the nozzle plate 2. The pitch between the nozzles 21 is suitably set according to the printing precision. For example, a resolution of 400 dpi can be set. The base 3 is a rigid component of plastic, metal, or the like, and is the foundation on which the pressure chamber substrate 1 is attached.

The principles of ink discharge will now be described through reference to FIG. 3(E). This figure is a cross section of the main components of an ink jet recording head. This figure illustrates a cross sectional shape produced by cutting these main components along a plane perpendicular to the lengthwise direction of the pressure chambers. In this figure, those components that are the same as in FIG. 2 are labeled the same, and will not be described again. Piezoelectric elements 5 are formed via diaphragm films 20 over the substrate 1 made up of a silicon single crystal substrate. The piezoelectric elements 5 are each equipped with a piezoelectric material sandwiched between an upper electrode 50 and a lower electrode 30. This figure illustrates a case in which the lower electrode is used as a common electrode for the various piezoelectric elements. When the desired voltage is applied to these piezoelectric elements 5, the piezoelectric films 40 are deformed, and the ink contained in the pressure chambers 10 is pressurized via the diaphragm films 20. This causes the ink contained in the pressure chambers 10 to be discharged from the nozzles 21 and to adhere to the specified recording paper, allowing printing or the like to be performed.

Method for Manufacturing an Ink Jet Recording Head

Figure 3:
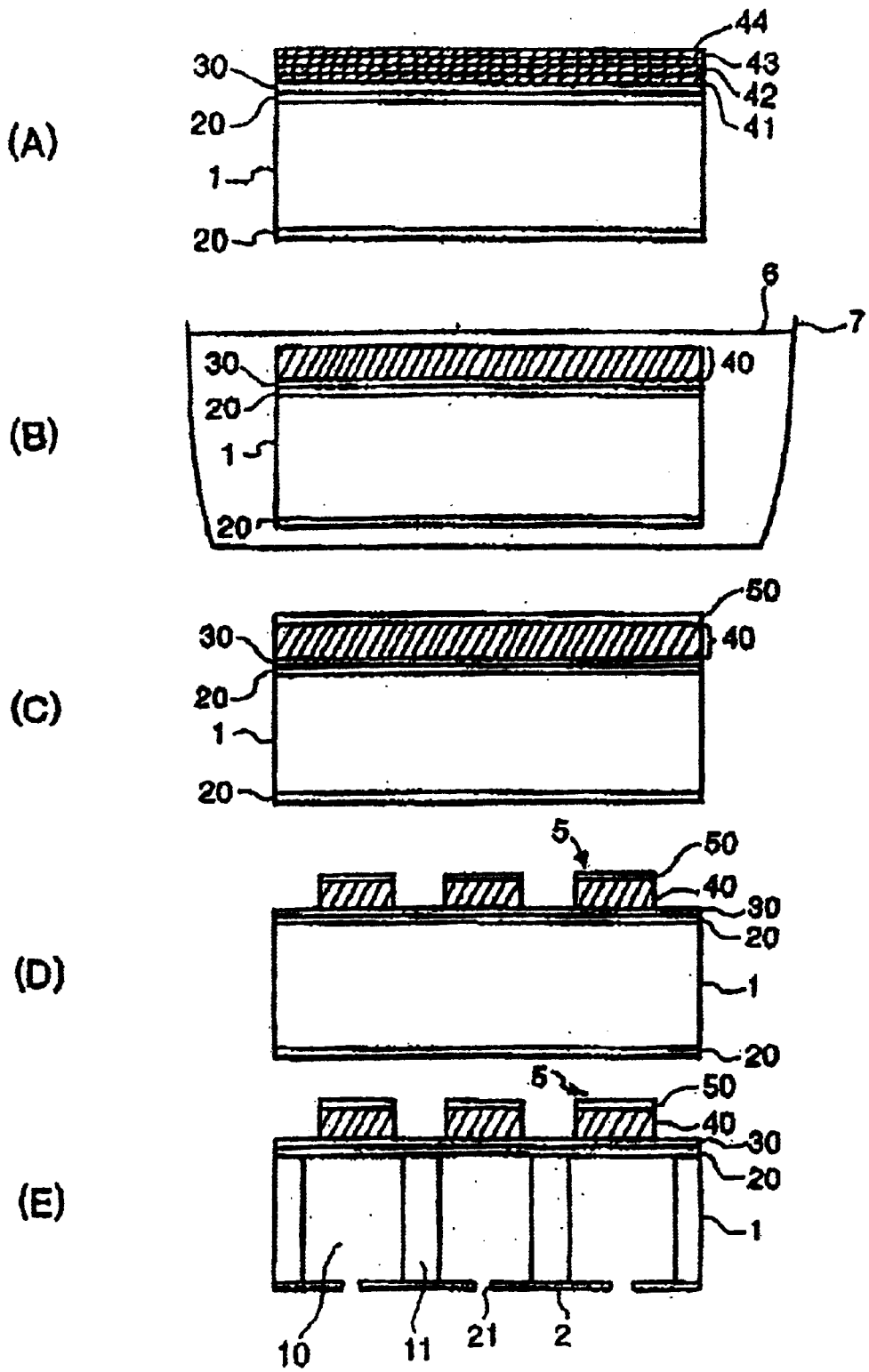
FIG. 3 consists of cross sections of the manufacturing steps of the ink jet recording head in an embodiment.

Next, a method for manufacturing an ink jet recording head will be described along with a first method for manufacturing a piezoelectric material. FIG. 3 consists of cross sections of the manufacturing steps, illustrating the first method for manufacturing an ink jet recording head. (A) through (C) in this figure are the same as the first method for manufacturing a piezoelectric material.

The first manufacturing method comprises the step of subjecting an oxide in an amorphous state to a hydrothermal processing using an aqueous solution containing the element "a'" (such as Ba), and crystallizing the oxide in the amorphous state, and the step of subjecting the piezoelectric material produced in the above step to a hydrothermal processing using an aqueous solution containing the element "a" (such as Pb).

Thin Film Lamination Step (FIG. 3(A))

In this step, the diaphragm film 20, lower electrode 30, and piezoelectric film precursors 41 to 44 are successively formed over the substrate 1. First, the diaphragm film 20 is formed over the substrate 1. A silicon single crystal substrate with a thickness of 220 $\mu$m, for example, is used as the substrate 1. When the ink jet recording head is to be used as a line printer, a silicon single crystal substrate formed in a slender shape is used, and the thickness thereof is set at about 200 $\mu$m, for example, so that the side walls will not be too tall. The diaphragm film 20 composed of silicon dioxide is formed by hot oxidation in a film thickness of 1.0 $\mu$m. In this step, a high-temperature treatment is performed in oxygen or an oxygen atmosphere containing water vapor. The function of this diaphragm film 20 is to transmit the deformation of a piezoelectric element to the pressure chamber and raise the ink pressure inside the pressure chamber. The material is not limited to silicon dioxide, and may instead be a zirconium oxide film, tantalum oxide film, silicon nitride film, or aluminum oxide film. Furthermore, the diaphragm film itself may be eliminated and the lower electrode (discussed below) made to double as a diaphragm film. The formation of the diaphragm film 20 is not limited to hot oxidation, and may instead involve CVD (Chemical Vapor Deposition).

Next, the lower electrode 30 is formed over the diaphragm film 20. For instance, a titanium film is formed in a thickness of 100 nm by sputtering over the diaphragm film 20 to obtain the lower electrode 30. When the lower electrode 30 is platinum, an adhesive layer of titanium, chromium, or the like (not shown) may be interposed between the diaphragm film 20 and the lower electrode 30 in order to increase the adhesive strength therebetween. This adhesive layer may be formed from titanium in a film thickness of 50 nm by sputtering.

Next, a piezoelectric film precursor is formed over the lower electrode 30. A piezoelectric ceramic having piezoelectric characteristics is used as the piezoelectric film. For instance, a PZT-based piezoelectric material, or the product of adding niobic acid or a metal oxide of nickel, magnesium, or the like is favorable as the piezoelectric film. More specifically, it is favorable to use lead titanate ($PbTiO_3$), lead zirconate-titanate ($Pb(Zr,Ti)O_3$; PZT), lead zirconate ($PbZrO_3$), lead-lanthanum titanate (($Pb,La)_2TiO_3$), lead-lanthanum zirconate-titanate (($Pb,La)(Zr,Ti)O_3$), lead zirconate-titanate magnesium-niobate ($Pb(Zr,Ti)(Mg,Nb)O_3$:PZT-PMN), or the like.

The following is a description of using $Pb(Zr_{0.56}Ti_{0.44})O_3$ as the composition of the piezoelectric film and forming the piezoelectric film precursors 41 to 44 by sol-gel method in this step. When a sol-gel method is employed, a piezoelectric film precursor is produced by coating and pyrolyzing the lower electrode with a hydrated complex of a hydroxide of a metal component capable of forming a piezoelectric film, that is, with a sol, and this piezoelectric film precursor is then crystallized in a hydrothermal processing to obtain an inorganic oxide (piezoelectric film). More specifically, an amorphous PZT-based piezoelectric film precursor in which the molar mixing ratio of lead titanate and lead zirconate is 44%:56% is formed by repeatedly coating, drying, and pyrolyzing the desired number of times until the film thickness is 0.4 μm.

The first step is to prepare the sol with which the lower electrode 30 will be coated. For example, 2-n-butoxyethanol is used as the main solvent, and titanium tetraisopropoxide and tetra-n-propoxyzirconium are mixed in this and agitated for 20 minutes at room temperature. Then, ethanolamine is added and the system is agitated for another 20 minutes at room temperature. Lead acetate is further added, and the system is heated to 80° C., after which it is agitated for 20 minutes in a heated state, and then allowed to cool naturally down to room temperature. A sol is obtained in this process.

The lower electrode 30 is spin coated with this sol in a thickness of 0.1 μm. In order to achieve a uniform sol film thickness, the spin coating is first performed for 30 seconds at 500 rpm, then for 30 seconds at 1500 rpm, and finally for 10 seconds at 500 rpm. At this stage the various metal atoms that make up the piezoelectric film are dispersed as an organometal complex.

After the lower electrode 30 has been coated with the sol, it is dried for 10 minutes at 180° C., for example. It is then pyrolyzed in an air atmosphere for 60 minutes at 350° C., for example. This pyrolyzing step is performed by gelling the film of the sol composition and heating for a time and at a temperature sufficient to remove the organic matter from the film. After this, the piezoelectric film precursor 41 is formed. This process creates a porous piezoelectric precursor thin film composed of an amorphous metal oxide containing substantially no residual organic matter. Pyrolyzing causes the organic matter coordinated to the metal to be dissociated from the metal, undergo an oxidizing combustion reaction, and diffuse into the atmosphere. This cycle of sol coating, drying, and pyrolyzing is repeated four times to build up the piezoelectric film precursors 41, 42, 43, and 44. Thus it is possible to form a thick film while preventing cracking by rendering the piezoelectric film precursors porous.

A piezoelectric film precursor with a thickness of 0.4 μm and comprising four laminated layers is obtained in the above process. In addition to the sol-gel method discussed above, the step of forming the piezoelectric film precursor can also be accomplished by RF sputtering, ion beam sputtering, MOD (Metal-Organic Deposition), electron beam vapor deposition, or another such method.

Hydrothermal Processing Step (FIG. 3(B))

This step promotes crystallization by subjecting the piezoelectric film precursor to a hydrothermal processing, and ensures the proper lead content in the crystallized piezoelectric film. The hydrothermal processing is performed in two stages. In the first hydrothermal processing, a barium hydroxide aqueous solution ($Ba(OH)_2$) is prepared as a treatment solution 6. The concentration of the treatment solution is about 0.05 to 0.5 M (mol/L). An advantage to barium hydroxide is that because it is less corrosive to the silicon substrate than potassium hydroxide is, a wider range of materials can be selected for the substrate 1. A water tank 7 is filled with this treatment solution 6. The piezoelectric film precursor obtained in the above step is immersed in the water tank 7 along with the substrate 1, and crystallization is accelerated in an autoclave.

The temperature of the hydrothermal processing here is set to between 120 and 200° C. Crystallization will not be promoted at a temperature below this range, but the piezoelectric film precursor and the substrate 1 will be undesirably etched at a temperature over this range. Treatment at a temperature of 140° C. is particularly favorable. Crystals of good quality can be obtained if the treatment pressure is set to between 2 and 10 atmospheres. A treatment pressure of 4 atmospheres is particularly favorable. The treatment time is 30 to 120 minutes, and about 60 minutes is particularly favorable. Satisfactory crystals cannot be obtained if the treatment time is too short, but the substrate will end up being etched if the treatment time is longer than necessary.

The piezoelectric film precursors 41 to 44 can be crystallized in this first hydrothermal processing. The crystallized piezoelectric film precursors 41 to 44 become the piezoelectric film 40.

However, there is a large amount of barium contained in the piezoelectric film 40 as a result of this first hydrothermal processing, which decreases the lead content. If there is a decrease in the lead content of the piezoelectric film, there will be a drop in both dielectric and piezoelectric properties. Accordingly, if a piezoelectric element featuring a piezoelectric material that has undergone hydrothermal processing using only barium hydroxide is used as an ink discharge drive source, the ink discharge characteristics may not be as good as in the past. In view of this, a second hydrothermal processing is performed to substitute this barium with lead and make up the lead deficiency.

First, the substrate is taken out of the water tank 7 and the barium hydroxide aqueous solution is drained. The water tank 7 is then filled with a lead hydroxide aqueous solution ($Pb(OH)_2$) as the next treatment solution. The concentration of the treatment solution is between 0.05 and 0.2 M (mol/L), and about 0.1 M (mol/L) is particularly favorable. The substrate is immersed in the treatment solution and heated to between 120 and 200° C., and preferably 140° C. The treatment pressure is set to between 2 and 10 atmospheres, and preferably 4 atmospheres. This second hydrothermal processing step allows the barium atoms that have infiltrated the crystals in the first hydrothermal processing to be substituted with lead atoms.

Upper Electrode Film Formation Step (FIG. 3(C))

After the hydrothermal processing step, the upper electrode 50 is formed over the piezoelectric film 40. A film of platinum is formed in a thickness of 200 nm over the piezoelectric film 40 using a thin film lamination technique such as electron beam vapor deposition or sputtering, resulting in the upper electrode 50. The material is not limited to platinum, however, and may instead be iridium, an alloy of platinum and iridium, iridium oxide, aluminum, or the like.

Piezoelectric Element Separation Step (FIG. 3(D))

In this step, the piezoelectric elements that serve as the ink discharge drive source are separated so as to correspond to the various pressure chambers. The upper electrode 50 is spin coated with a resist (not shown) and then patterned by being exposed and developed at the positions where the pressure chambers are to be formed. Using this resist as a mask, a method such as ion milling or dry etching is applied to etch the laminate structure composed of the upper electrode 50 and the piezoelectric film 40. This step separates the piezoelectric elements 5 at the positions where the pressure chambers are to be formed.

Pressure Chamber Formation and Nozzle Plate Joining Step (FIG. 3(E))

In this step, the pressure chambers 10 are formed on the substrate 1 and the nozzle plate 2 is joined. Using anisotropic etching with an active gas, such as parallel plate reactive ion etching, the spaces where the pressure chambers 10 are formed are etched. The portions of the substrate that are not etched and remain behind become the side walls 11. Upon completion of the etching, the nozzle plate 2 is joined to the substrate 1. At this point, the nozzles 21 are positioned so as to correspond to the various spaces of the pressure chambers 10. The ink jet recording head is completed by applying the substrate 1 on which the pressure chambers 10 have been formed to the base 3. When the nozzle plate 2 and the substrate 1 are integrally formed by etching, the step of joining the nozzle plate 2 is not necessary.

EXAMPLES

Figure 4:
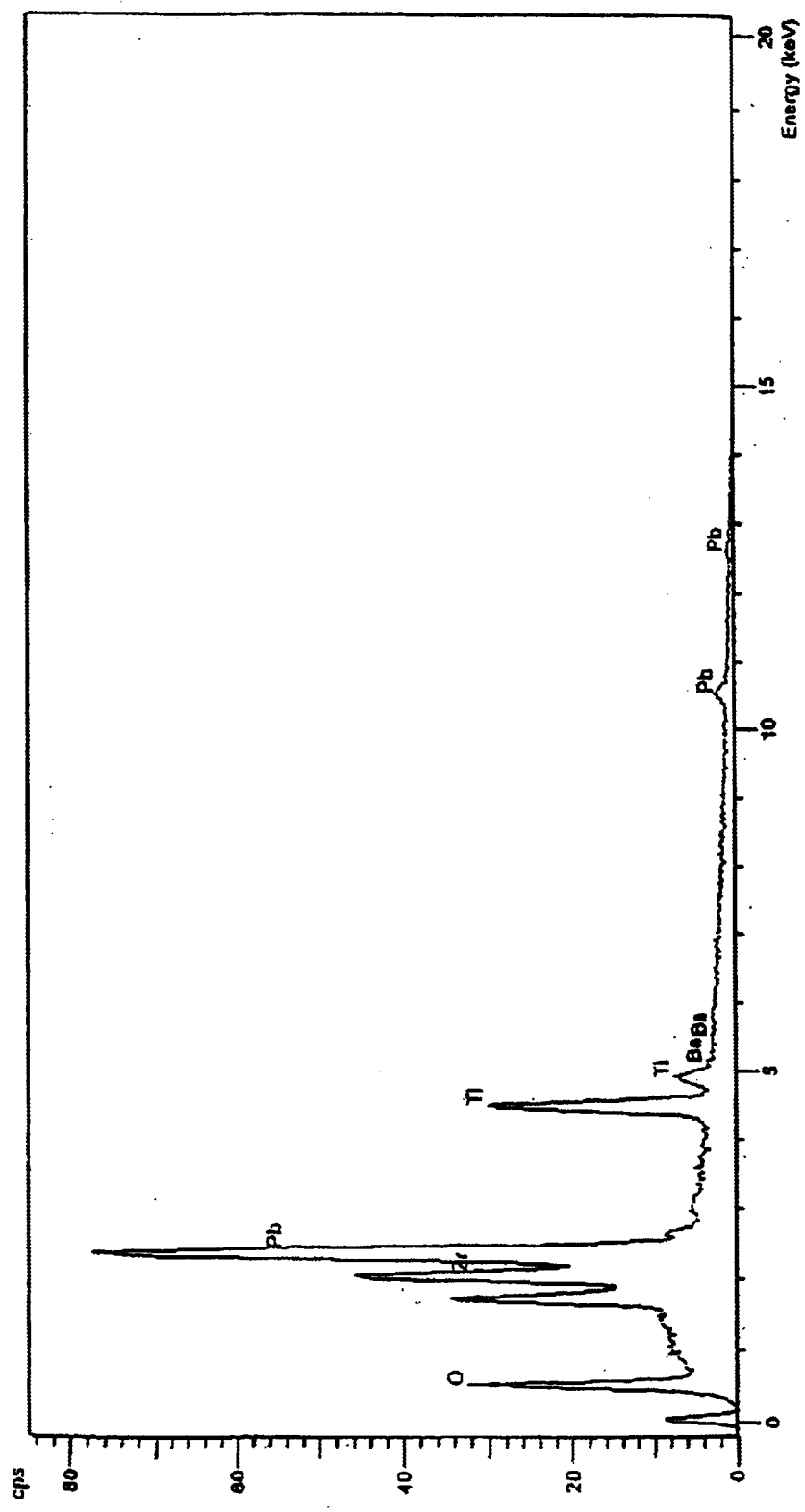
FIG. 4 is a graph of the EDX spectrum of a piezoelectric material manufactured by a first manufacturing method.
Figure 5:
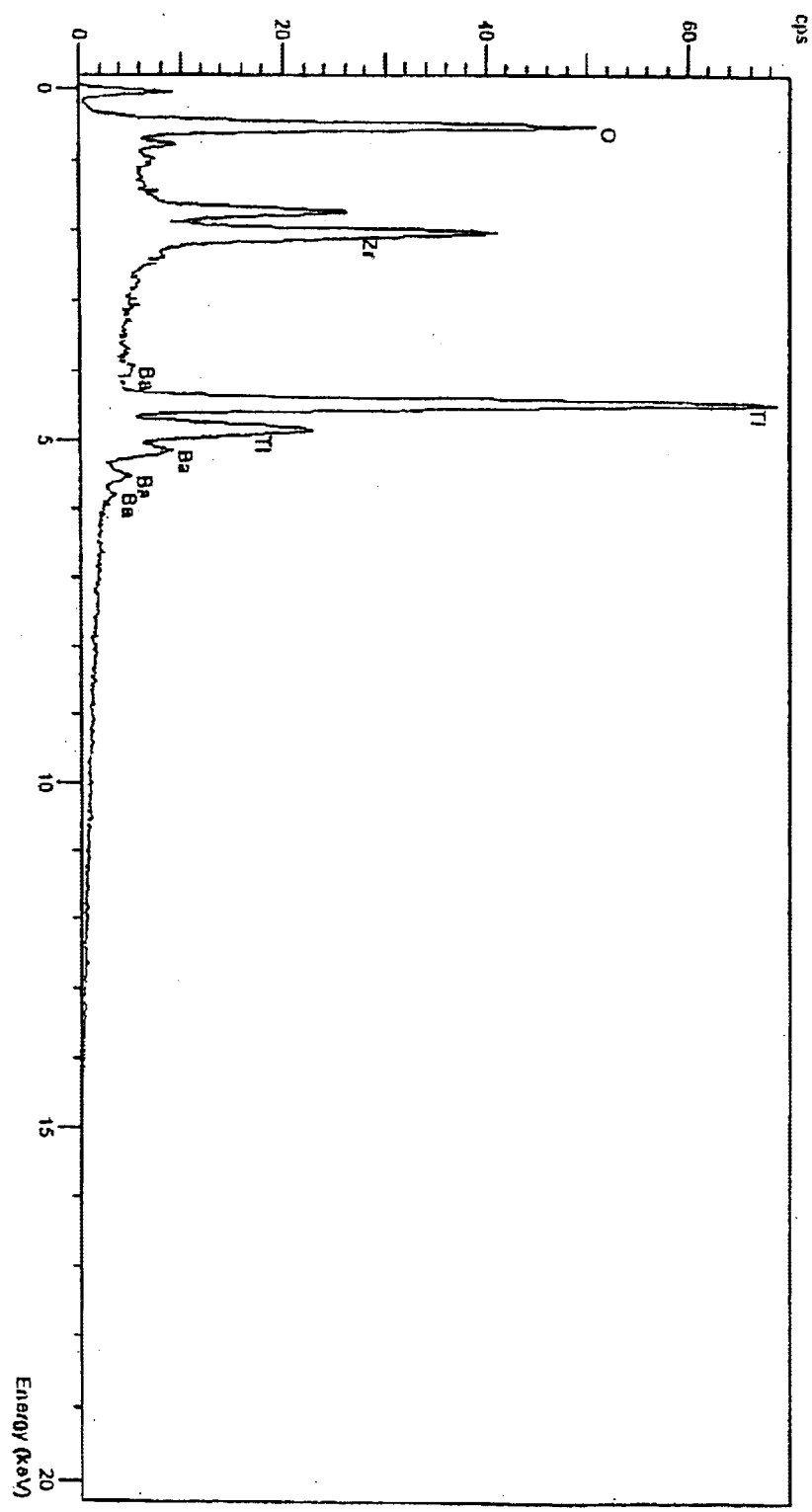
FIG. 5 is a graph of the EDX spectrum of a piezoelectric material manufactured by a conventional hydrothermal method.
Figure 6:
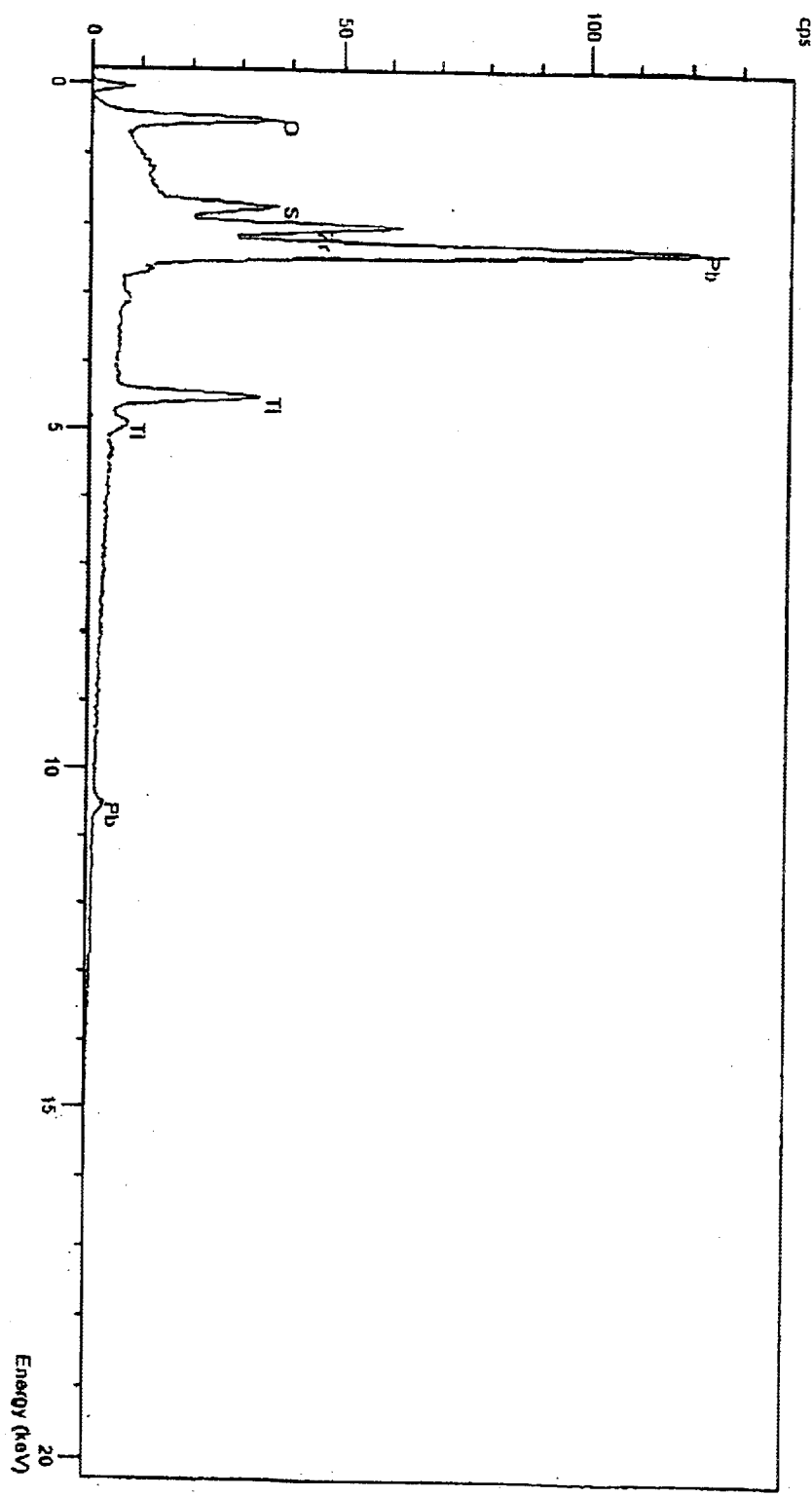
FIG. 6 is a graph of the EDX spectrum of a piezoelectric material manufactured by a conventional sol-gel method.

FIG. 4 is a graph of the EDX spectrum of a piezoelectric material manufactured in this embodiment, while FIG. 5 is a graph of the EDX spectrum of a piezoelectric material manufactured by a conventional method (hydrothermal processing with barium hydroxide). The composition of the piezoelectric film in both cases is $Pb(Zr_{0.56}Ti_{0.44})O_3$. As can be seen from a comparison of these figures, the lead content in the piezoelectric film manufactured in this embodiment is greater than the lead content in the piezoelectric film manufactured by the conventional method. These results tell us that after the piezoelectric film is crystallized with barium hydroxide in the first hydrothermal processing, the barium atoms are substituted with lead atoms in the second hydrothermal processing, which ensures a satisfactory lead content in the piezoelectric film. Also, a comparison of the EDX spectrum of a piezoelectric film manufactured in this embodiment (FIG. 4) with the EDX spectrum of a piezoelectric film manufactured by a conventional sol-gel method (FIG. 6) reveals that the piezoelectric film manufactured in this embodiment had substantially the same composition as the piezoelectric film manufactured by a conventional sol-gel method. The amount of barium contained in the crystals of the piezoelectric film manufactured in this embodiment was 5 at % or less.

The conclusion to be drawn from the above experimental results is that since a weak alkali aqueous solution such as potassium hydroxide is not used and the treatment solution is instead a barium hydroxide aqueous solution and a lead hydroxide aqueous solution with the manufacturing method in this embodiment, the etching of the substrate or piezoelectric elements during the hydrothermal processing step is prevented, and the piezoelectric film precursor can be reliably crystallized. Also, by first performing a hydrothermal processing with barium hydroxide and then performing a hydrothermal processing with lead hydroxide, the barium atoms in the crystals of the piezoelectric film can be substituted with lead atoms, and a piezoelectric film can be manufactured with substantially the same composition as when a sol-gel method is employed. As a result, a piezoelectric material having the same composition can be manufactured in an environment with a lower temperature than when a sol-gel method is used for film formation.

In general, film formation by sol-gel method requires a temperature of about 900° C. in the final annealing by RTA (Rapid Thermal Annealing), but with the manufacturing method in this embodiment, a piezoelectric material can be manufactured at a low temperature of 200° C. or lower, thereby reducing internal stress in the film during its formation. Accordingly, piezoelectric elements can be made larger (greater surface area), which is favorable for the ink discharge drive source of an ink jet recording head in a large-surface area printer such as a line printer. Forming a piezoelectric film in a low temperature environment also makes possible a piezoelectric thick film, and since only a weak electric field will be produced when voltage is applied to the film, reliability of the film is better.

Also, with the manufacturing method in this embodiment, the proper amount of lead contained in the piezoelectric film can be ensured, and the same piezoelectric characteristics as when film formation is by sol-gel method can be preserved. Accordingly, the ink discharge characteristics are better than with a conventional manufacturing method in which only barium hydroxide is used in the hydrothermal processing.

Second Manufacturing Method

The second method of the present invention for manufacturing a piezoelectric material will now be described. The above-mentioned first manufacturing method comprised a step of producing a precursor film of lead zirconate-titanate ($Pb(Zr,Ti)O_3$) and then crystallizing this film by subjecting it to a hydrothermal processing in a barium hydroxide ($Ba(OH)_2$) aqueous solution, and a step of subjecting this crystalline material to a hydrothermal processing in a lead hydroxide ($Pb(OH)_2$) aqueous solution to make up for the lead deficiency. In contrast, the second manufacturing method comprises a step of producing a crystalline material of barium zirconate-titanate ($Ba(Zr,Ti)O_3$), and a step of subjecting this to a hydrothermal processing in a lead hydroxide ($Pb(OH)_2$) aqueous solution to substitute the A site atoms in the crystals with lead. The rest of the process is the same as in the first manufacturing method described above, and will not be described in detail again.

The concentration of the above-mentioned lead hydroxide aqueous solution is preferable 0.05 to 2.0 mol/L. This is because it was found experimentally that the substitution of A site atoms is carried out more favorably at an alkali concentration in this range. The concentration is set, for example, to 0.1 mol/L.

As to the conditions of the hydrothermal processing, it is preferable for the treatment temperature to be between 120 and 200° C. This is because substitution will not be promoted if the temperature is below this range, but the piezoelectric layer and the silicon substrate will be etched if the temperature is over this range. The temperature is set to about 140° C., for example. It is preferable for the pressure in the autoclave to be within a range of 2 to 20 atmospheres. This is because good atom substitution will not be achieved at a pressure outside of this range. The pressure is set to about 5 atmospheres, for example. It is preferable for the treatment time to be within a range of 15 to 120 minutes. This is because adequate substitution cannot be achieved in less time than this, but there is the danger that the piezoelectric layer or the substrate will be corroded if the treatment lasts longer than this. The treatment time is set to about 60 minutes, for example.

EXAMPLES

Figure 8:
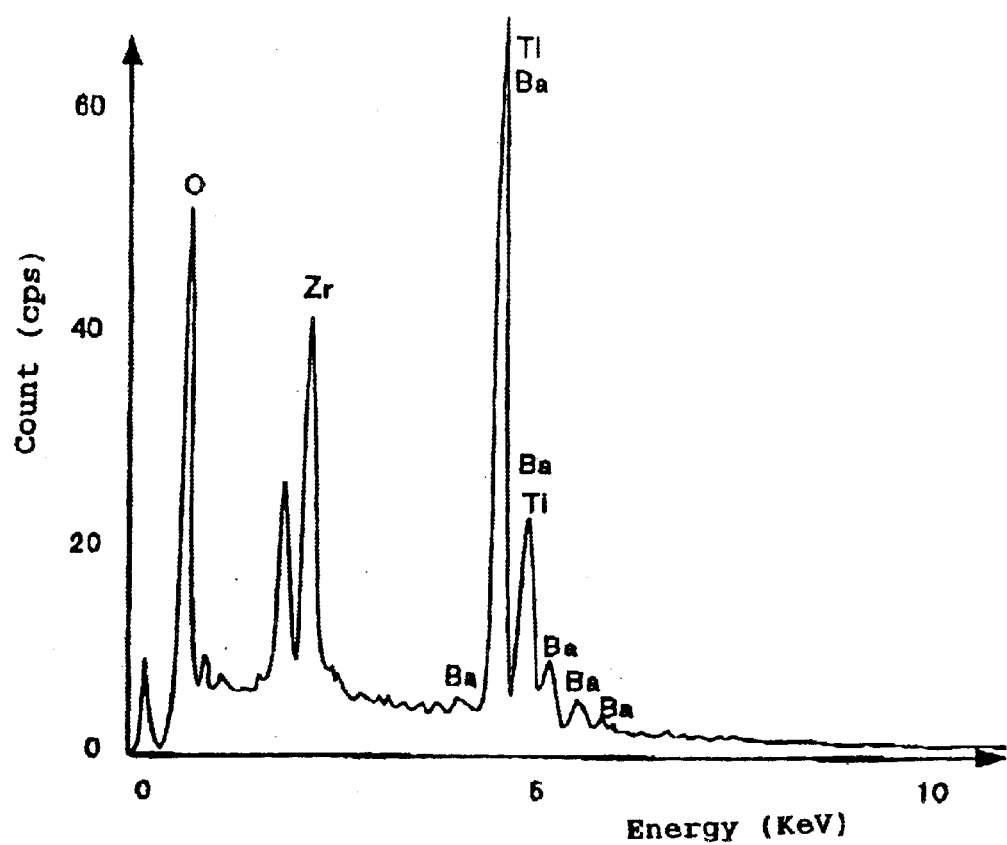
FIG. 8 is a graph of the EDX spectrum of a crystalline body (an example) before the execution of the hydrothermal processing of the present invention.
Figure 9:
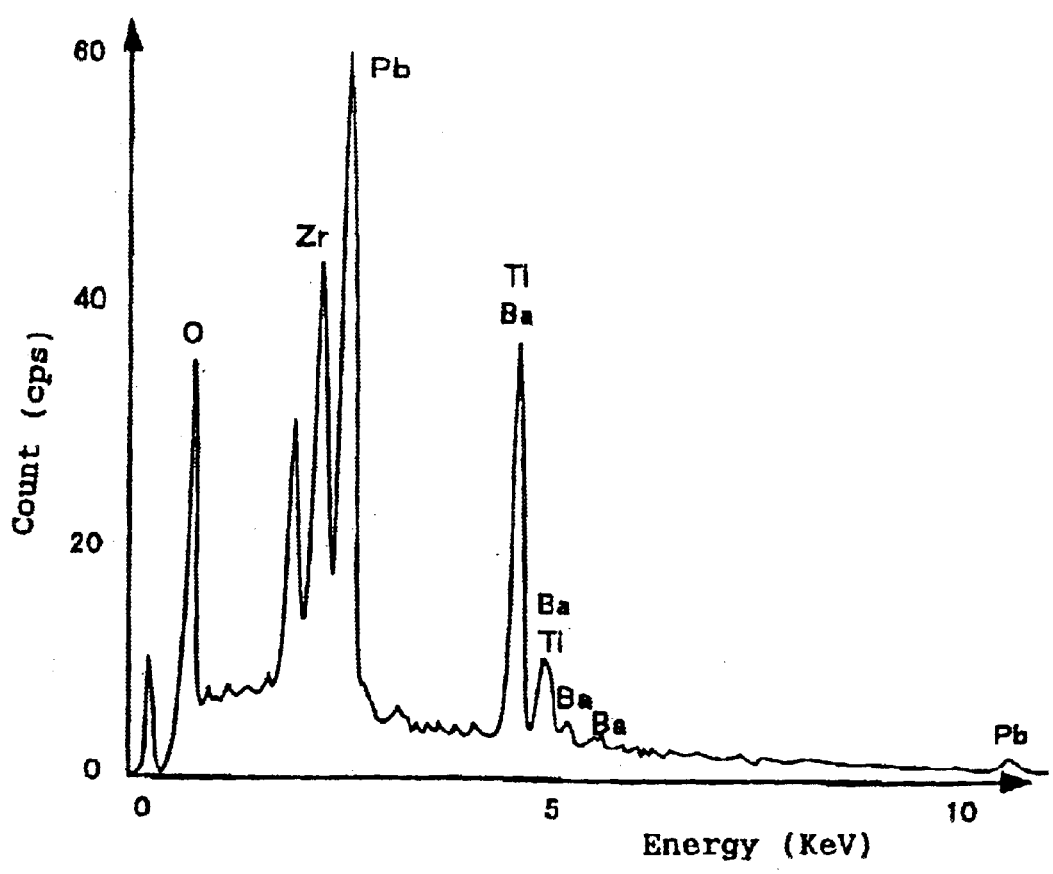
FIG. 9 is a graph of the EDX spectrum of the product of a second manufacturing method.

A piezoelectric actuator, which is a piezoelectric element, equipped with a piezoelectric material expressed by the compositional formula $Pb_xBa_{(1-x)}(Zr_{56}Ti_{44})O_3$ was manufactured according to the above manufacturing method. FIG. 8 is a graph of the EDX spectrum of a piezoelectric crystalline thin film expressed $Ba(Zr_{56}Ti_{44})O_3$ as the composition prior to the hydrothermal processing. FIG. 9 is a graph of the EDX spectrum of the final product when the hydrothermal processing was conducted over a period of 60 minutes under conditions of 140° C. and 5 atmospheres with an alkali aqueous solution containing 0.1 M (mol/L) of $Pb(OH)_2$.

In FIG. 8 we see that a large amount of barium (Ba) is present, with the rest of the peaks being O, Zr, and Ti. When a hydrothermal processing is performed on this material, as shown in FIG. 9, the composition of the crystalline film changes such that the lead (Pb) content is much higher than it was in the film before treatment, and this is accompanied by a reduction in the barium (Ba) content.

The crystalline material of barium titanate-zirconate that is subjected to the hydrothermal processing may be produced by a hydrothermal method, or may be produced by sintering, sputtering, or the like. The present invention can also be applied to a piezoelectric crystalline film produced by electron beam vapor deposition, MOD, or CVD. The manufacture of a crystalline material containing no lead, such as barium titanate-zirconate, is particularly advantageous in that there is no scattering of lead during production, so the process is gentler to the environment.

With the above-mentioned second manufacturing method, it is possible to form a piezoelectric material with any composition desired by selecting the metal elements mixed in the aqueous solution. In other words, even though not all the metal elements are included from the initial crystal production stage, if the metal elements contained in the alkali aqueous solution used for the hydrothermal processing are included, it will be possible to dispose both the metal elements included at the outset and the metal elements included in the hydrothermal processing aqueous solution at the A site atoms of the perovskite crystal structure.

Also, with the above second manufacturing method, lead (Pb) is not used as a raw material at the crystal production stage, and can be added to the A site of the perovskite crystal structure by means of the hydrothermal processing at the end, so subjecting lead to a high-temperature treatment can be avoided, which helps to prevent elements such as lead from flowing out of the material. Another advantage to not using a high temperature is that less energy is consumed.

Third Manufacturing Method

The third method of the present invention for manufacturing a piezoelectric material will now be described. The third manufacturing method involves subjecting an oxide in an amorphous state which is a precursor to PZT to a hydrothermal processing using $Pb(OH)_2$ and $Ba(OH)_2$. This crystallizes the precursor film and at the same time coordinates Pb and Ba as A site atoms of piezoelectric crystals. In particular, the mixing ratio of A site atoms can be controlled by means of the mixing ratio of the above-mentioned $Pb(OH)_2$ and $Ba(OH)_2$. The rest of the steps are the same as in the above-mentioned first manufacturing method, and will not be described in detail again.

The lead (Pb) here plays an important role in the piezoelectric characteristics of PZT, and the barium (Ba) contributes to the alkaline environment suitable for a hydrothermal method.

It is important that the ratio in which the elemental lead and barium are present in this alkali aqueous solution be adjusted ahead of time. For instance, it is preferable for the ratio of lead and barium to be adjusted to a range of from 2:8 to 4:6. This is because experiments have shown that piezoelectric crystals exhibiting favorable piezoelectric characteristics will be obtained within this ratio range. Consequently, hydroxides of these elements ($Pb(OH)_2$ and $Ba(OH)_2$) are mixed in the above-mentioned molar ratio and the precursor film is subjected to a hydrothermal processing. It is preferable for the hydrothermal processing to be performed with the total number of moles of the two elements adjusted to between 0.05 and 0.5 (mol/liter). This is because experiments have shown that favorable crystallization is promoted at an alkali concentration within this range.

As to the conditions of the hydrothermal processing, it is preferable for the treatment temperature to be between 120 and 200° C. This is because crystallization will not be promoted at a temperature below this range, but the piezoelectric layer and the silicon substrate will be etched at a temperature over this range. The treatment temperature is set to about 140° C., for example. It is preferable for the pressure in the autoclave to be within a range of 2 to 20 atmospheres. This is because good crystals will not be obtained outside of this range. The pressure is set to about 5 atmospheres, for example. It is preferable for the treatment time to be within a range of 15 to 90 minutes. This is because adequate crystallization cannot be achieved in less time than this, but there is the danger that the piezoelectric layer or the substrate will be corroded if the treatment lasts longer than this. The treatment time is set to about 30 minutes, for example.

An element selected from among strontium, lanthanum, and calcium may be used besides barium in order to obtain a piezoelectric material for a piezoelectric actuator.

In the course of this hydrothermal processing, the lead contained in the piezoelectric film precursor is substituted with the barium in the aqueous solution and crystallized, and the barium at the A site of the crystal structure is again substituted with the lead in the aqueous solution, so that ultimately crystals of a piezoelectric material are formed in a compositional ratio that is correlated to the metal compositional ratio in the alkali aqueous solution.

EXAMPLES

Figure 10:
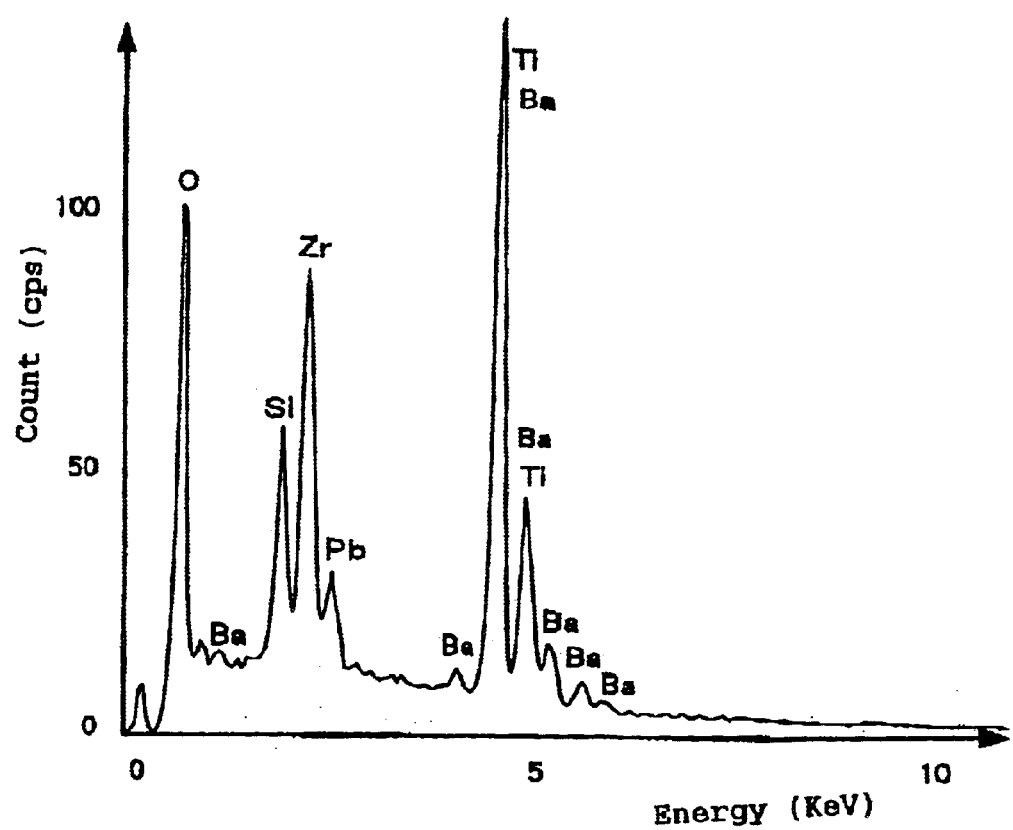
FIG. 10 is a graph of the EDX spectrum in a comparative example involving a hydrothermal processing by a conventional method.
Figure 11:
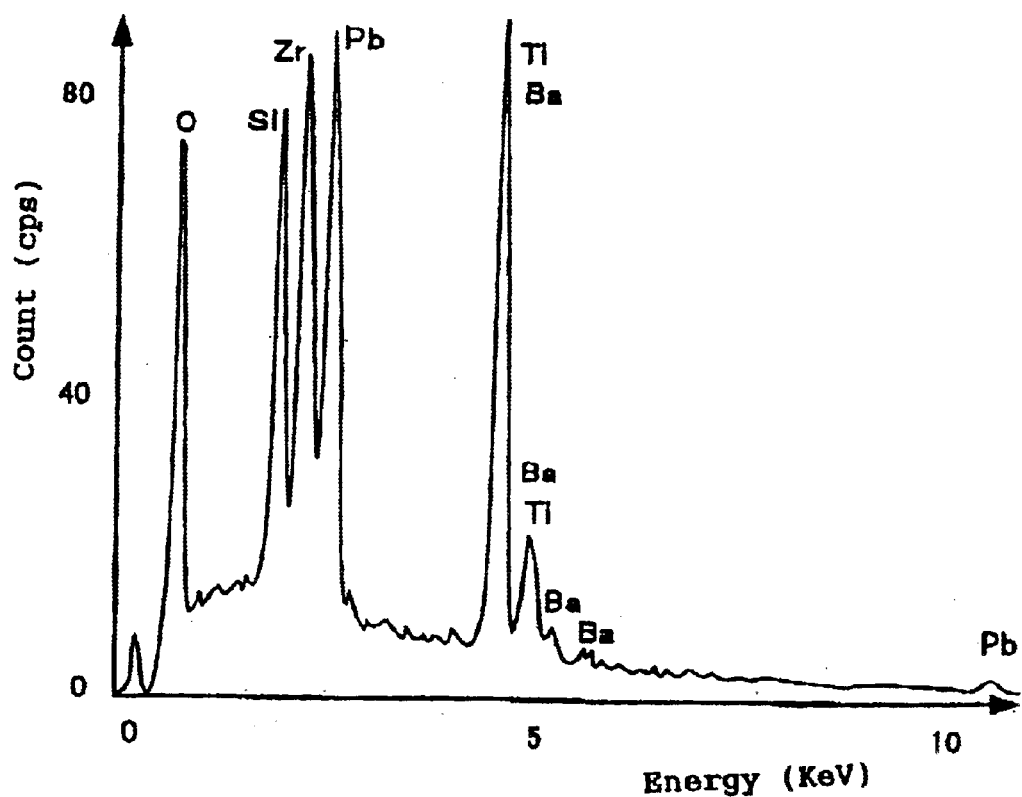
FIG. 11 is a graph of the EDX spectrum of the product of a third manufacturing method when the ratio of barium:lead is 6:4.

A piezoelectric actuator, which is a piezoelectric element, equipped with a piezoelectric material expressed by the compositional formula $Pb_xBa_{(1-x)}(Zr_{56}Ti_{44})O_3$ was manufactured according to the above third manufacturing method. FIG. 13 is a graph of the EDX spectrum piezoelectric precursor film as the composition before hydrothermal processing. As a comparative example of a conventional method, FIG. 10 is a graph of the EDX spectrum of the final product when the hydrothermal processing was performed with an alkali aqueous solution of just $Ba(OH)_2$ (molar ratio of barium and lead=1:0). As Example 1 of the present invention. FIG. 11 is a graph of the EDX spectrum of the final product when the hydrothermal processing w performed with an alkali aqueous solution in which the molar ratio of barium and lead as adjusted to 6:4. As Example 2 of the present invention, FIG. 12 is a graph of the EDX spectrum of the final product when the hydrothermal processing was performed with an alkali aqueous solution in which the molar ratio of barium and lead was adjusted to 4:6.

FIG. 13 shows that metal is present just as in the composition of the metal alkoxide solution. When this material is subjected to a hydrothermal processing by a conventional method, as shown in FIG. 10, the composition of the piezoelectric film is such that more barium (Ba) is incorporated into the composition and there is much less lead (Pb) than in the composition of the precursor film. This was the problem encountered in the past.

Figure 12:
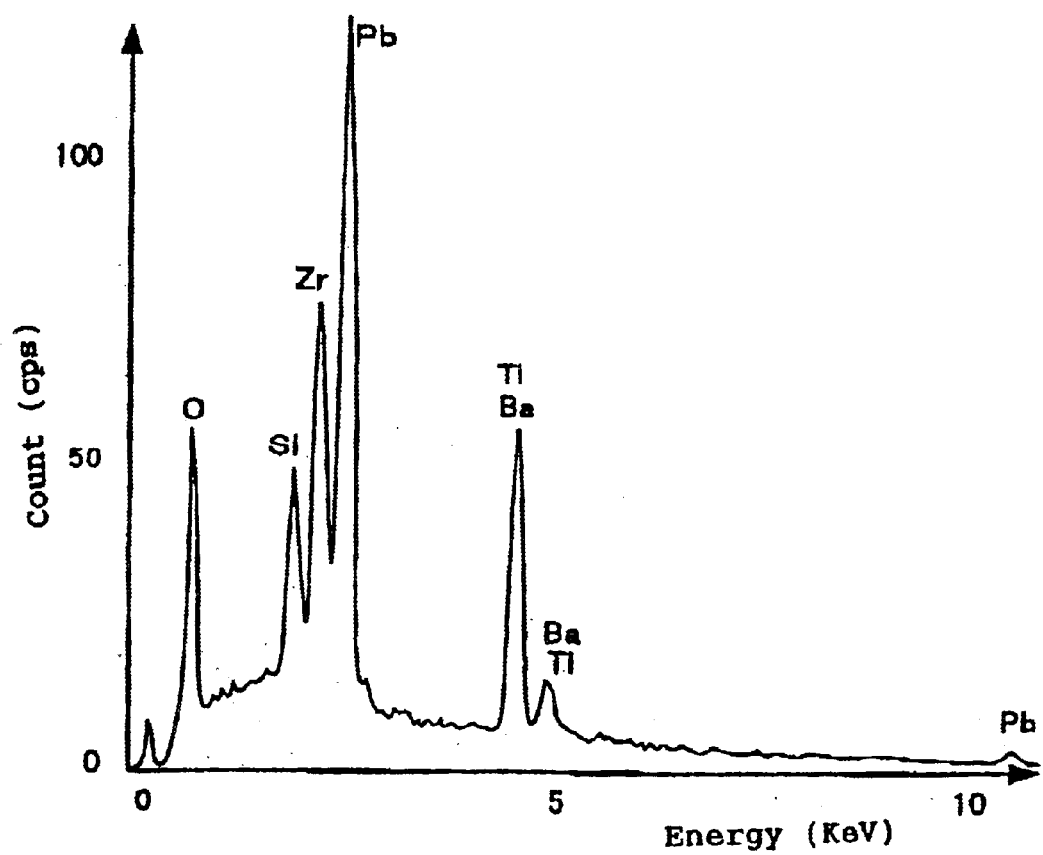
FIG. 12 is a graph of the EDX spectrum of the product of a third manufacturing method when the ratio of barium:lead is 4:6.
Figure 13:
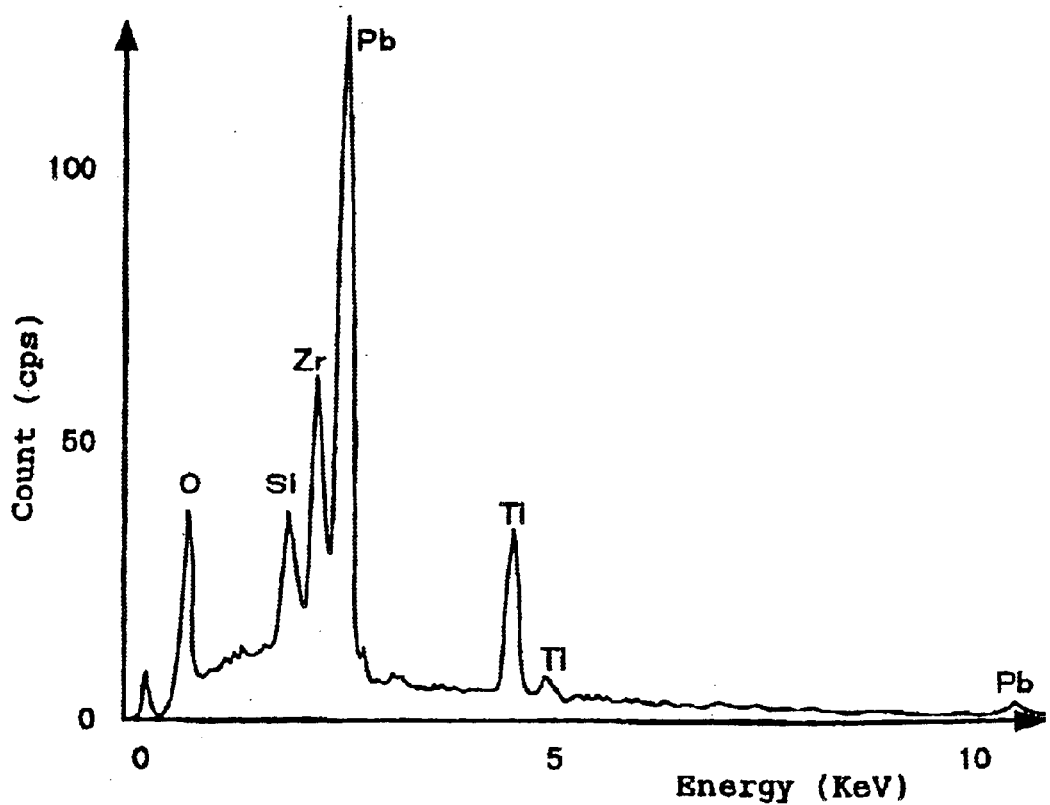
FIG. 13 is a graph of the EDX spectrum illustrating the composition in a piezoelectric material precursor.

In contrast, when the hydrothermal processing is performed using the aqueous solution of the present invention, it can be seen from FIGS. 11 and 12 that there is a dramatic recovery in the lead deficiency.

As a comparison of FIGS. 11 and 12 reveals, when the proportion of lead in the alkali aqueous solution rises, there is a corresponding increase in the amount of lead in the piezoelectric material. However, the piezoelectric material did not crystallize when the proportion of lead in the alkali aqueous solution was further increased until only lead was present (that is, when the ratio of barium and lead was 0:1). It was found that about 2:8 is the limit to the proportion of barium and lead in order for an alkaline environment to be maintained.

Meanwhile, an experiment was conducted to manufacture a piezoelectric material containing both barium and lead as the final product, in which barium was admixed into a sol of a metal alkoxide and a plurality of metal elements were mixed in at the precursor film stage, whereupon compounds of barium resulted in precipitation and a piezoelectric material composed of a plurality of elements could not be crystallized.

The above-mentioned third manufacturing method offers the following advantages.

a) With this embodiment, the hydrothermal processing is performed using an aqueous solution containing lead, which affects piezoelectric characteristics, so it is possible to prevent the lead deficiency in the piezoelectric material which occurred in the past.

b) With this embodiment, the hydrothermal processing is performed using an aqueous solution prepared such that a plurality of metals are included, permitting the manufacture of a piezoelectric material having a plurality of metal elements as the A site atoms in a perovskite crystal structure.

Specifically, selecting the metal elements that are mixed in the aqueous solution makes it possible to form a piezoelectric material with any composition desired. In other words, even though a solution containing all of the metal elements is not prepared at the initial sol stage, if the metal elements contained in the alkali aqueous solution used for the hydrothermal processing are included, it will be possible to dispose the metal elements not included in the initial sol at the A site atoms of the perovskite crystal structure.

Also, unlike in the above-mentioned first and second manufacturing methods, the treatment in which an oxide in an amorphous state is crystallized and the treatment in which the desired metal elements are added to the A site of the perovskite crystal structure can be conducted with a single hydrothermal processing.

Fourth Manufacturing Method

The fourth method of the present invention for manufacturing a piezoelectric material will now be described. The fourth manufacturing method is similar to the above-mentioned second manufacturing method, and comprises a step of producing lead titanate ($PbTiO_3$) composed of acicular crystals by MOD, and a step of subjecting this lead titanate to a hydrothermal processing using a barium hydroxide ($Ba(OH)_2$) aqueous solution to produce barium-lead titanate (($Ba,Pb)TiO_3$). The rest of the process is the same as in the first manufacturing method described above, and will not be described in detail again.

It is generally preferable for the crystal grains to be large and acicular in order to enhance the piezoelectric characteristics of a piezoelectric material. However, it is difficult to produce large, acicular crystal grains from barium titanate ($BaTiO_3$), and the crystal grains turn out small when manufactured by MOD or a sol-gel method, for example. In contrast, it is relatively easy to produce large-diameter, acicular crystal grains by MOD from lead titanate ($PbTiO_3$). In view of this, if a crystalline material of lead titanate is produced by MOD, and is then subjected to a hydrothermal processing with a barium hydroxide aqueous solution, at least 95% of the A sites can be s substituted with barium. Specifically, it is possible with this manufacturing method to produce lead-barium titanate expressed by the chemical formula ($Ba_xPb_{1-x})TiO_3$, where x in this formula is within the range of $0<x<0.05$.

Figure 14:
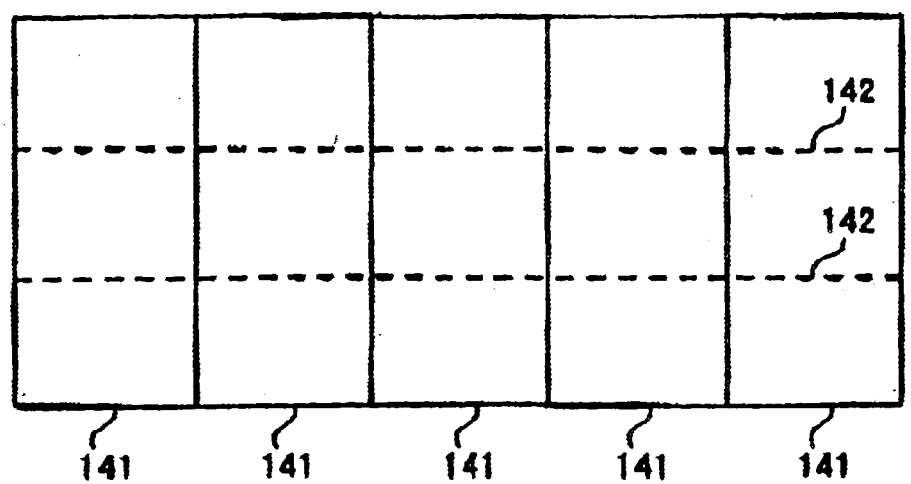
FIG. 14 is a conceptual diagram illustrating the acicular crystals and dislocation layers of a piezoelectric material manufactured by a fourth manufacturing method.

The piezoelectric material manufactured by the above-mentioned fourth manufacturing method also has fewer dislocation layers in which lattice defects are present. FIG. 14 is a conceptual diagram illustrating the acicular crystals and dislocation layers of a piezoelectric material manufactured by the fourth manufacturing method. With barium titanate produced by a conventional method, the spacing between dislocation layers was less than 10 nm, and this naturally increased the number of dislocation layers. In contrast, as shown in FIG. 14, the lead-barium titanate manufactured with this manufacturing method is such that the spacing of the dislocation layers 142 formed in the acicular crystal grains 141 can be widened to 10 nm or more, and even to 200 nm or more.

A wider spacing between dislocation layers means that there are fewer lattice defects. Therefore, piezoelectric characteristics are enhanced and there is a higher strain limit at which the piezoelectric film will break. An increase in the piezoelectric constant is also seen.

Figure 15:
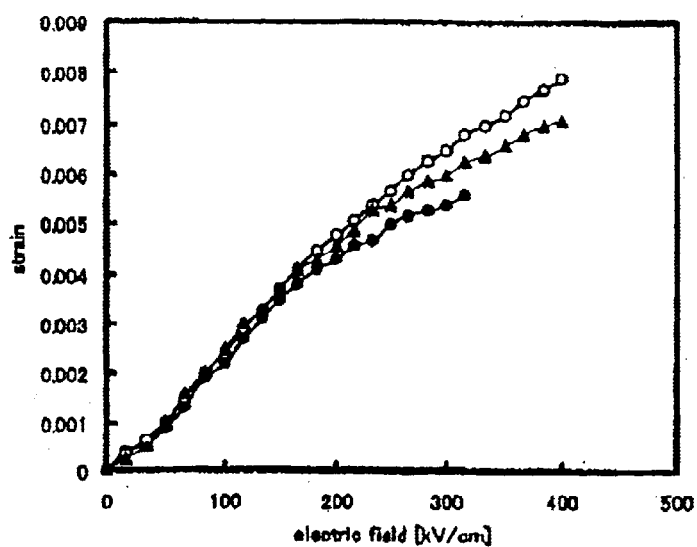
FIG. 15 is a graph comparing the electric field strength dependence of strain for certain piezoelectric bodies by the number of dislocation layers at a constant film thickness.

FIG. 15 is a graph comparing the electric field strength dependence of strain for certain piezoelectric bodies by the number of dislocation layers at a constant film thickness. The maximum value for strain in the curves of this graph indicates the strain limit at which the film breaks on the curve. It can be seen from this graph that the fewer dislocation layers there are, the higher is the strain limit at which the film breaks. It can also be seen that the fewer dislocation layers there are, the greater is the strain (amount of displacement) with respect to electric field strength.

Therefore, when a piezoelectric element is manufactured using this piezoelectric material, a piezoelectric element with excellent voltage resistance and piezoelectric characteristics can be manufactured. Also, when an ink jet recording head equipped with these piezoelectric elements as piezoelectric actuators is manufactured, an ink jet recording head that is durable and has excellent discharge characteristics can be manufactured.

Other Variation Examples

The present invention is not limited to the above embodiments, and can be applied in various modified forms as well. For instance, PZT was given as an example in the above embodiments, but the piezoelectric material may be one in which a metal element other than zirconium or titanium is disposed as the B site atoms.

Examples of the sol composition and manufacturing steps were also given, but other methods can also be applied without exceeding the technological idea of the present invention.

Also, the piezoelectric crystalline material to which the present invention can be applied is not just a thin film, and may be a bulk material instead.

The piezoelectric material formed with the present invention can be applied as a piezoelectric element for a piezoelectric actuator, ink jet recording head, or the like.

Furthermore, the piezoelectric elements in the embodiments can be made larger, so a printer can be provided with which large-surface area printing is possible, such as a line printer.

With the method of the present invention for manufacturing a piezoelectric material, when a piezoelectric material is manufactured by hydrothermal method, the proper amount of lead contained in the piezoelectric film can be ensured and decreases in piezoelectric characteristics can be prevented. Furthermore, the present invention provides a method for easily controlling the component ratio of the metal elements that make up the piezoelectric material. Also provided is a method for manufacturing a piezoelectric material that imposes less burden in terms of environmental concerns, such as preventing the outflow of metals. Further provided is a method for adding metal elements not included in the precursor as A site atoms in the perovskite structure of the final product.

The present invention also provides a method for manufacturing an ink jet recording head, wherein the proper amount of lead contained in the piezoelectric film can be ensured while manufacturing an ink jet recording head with excellent ink discharge characteristics.

What is claimed is:

1. A method for manufacturing a piezoelectric element having a piezoelectric material with a perovskite crystal structure expressed by the formula $ABO_3$ in which the symbol A represents at least an element "a", comprising the steps of:
    a) forming a lower electrode;
    b) forming over the lower electrode a film of the piezoelectric material having a perovskite crystal structure expressed by the formula $ABO_3$ in which the symbol A represents at least an element "a" by,
        a first step of producing an oxide in an amorphous state containing an element "a'" and subjecting the oxide to a hydrothermal process using an aqueous solution containing the element "a'" thereby crystallizing the oxide, wherein the oxide produced in the first step is a piezoelectric material having a perovskite crystal structure expressed by the formula $ABO_3$ in which the symbol A represents at least an element "a'"; and
        a second step of producing a piezoelectric material by subjecting the oxide produced in the first step to a hydrothermal process using an aqueous solution containing the element "a", so as to increase the amount of the element "a" contained in the piezoelectric material due to its substitution for element "a'" contained in the oxide produced in the first step; and
    c) forming an upper electrode over the piezoelectric material formed in step b.

2. A method of forming an ink-jet recording head, comprising the steps of:
    forming a diaphragm film over a substrate;
    manufacturing a piezoelectric element over the diaphragm film by the method for manufacturing a piezoelectric element according to claim 1; and
    working the substrate and forming a pressurization chamber at a site capable of transmitting displacement of the diaphragm film produced by driving of the piezoelectric element.

3. A method for manufacturing a piezoelectric element having a piezoelectric material with a perovskite crystal structure expressed by the formula $ABO_3$ in which the symbol A represents at least an element "a", comprising the steps of:
    a) forming a lower electrode;
    b) forming over the lower electrode a film of the piezoelectric material having a perovskite crystal structure expressed by the formula $ABO_3$ in which the symbol A represents at least an element "a" by,
        a first step of producing an oxide in an amorphous state containing an element "a'"; and
        a second step of producing a piezoelectric material by crystallizing the oxide produced in the first step in a hydrothermal process using an aqueous solution containing the element "a", so as to increase the amount of the element "a" contained in the piezoelectric material due to its substitution for element "a'" contained in the oxide produced in the first step; and
    c) forming an upper electrode over the piezoelectric material formed in step b.

4. The method for manufacturing a piezoelectric element according to claim 3, wherein the hydrothermal process performed in step b is conducted using an aqueous solution containing both the element "a" and the element "a'", and wherein the ratio in which the element "a" and the element "a'" are present in the aqueous solution is between 2:8 and 4:6.

5. The method for manufacturing a piezoelectric element according to claim 4, wherein the aqueous solution containing the element "a" is an alkali aqueous solution of a compound expressed by the formula $a'(OH)_n$ (n=1, 2, or 3).

6. The method for manufacturing a piezoelectric element according to claim 3, wherein the oxide in an amorphous state produced in step b is produced by pyrolyzing a sol containing an organometallic.

* * * * *